US007992950B2

(12) United States Patent
Lauchner

(10) Patent No.: US 7,992,950 B2
(45) Date of Patent: Aug. 9, 2011

(54) METHOD FOR INSTALLING A SLIDE ASSEMBLY FOR A COMPUTER SERVER USING DUAL FLAT SPRINGS

(75) Inventor: Craig E Lauchner, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1511 days.

(21) Appl. No.: 10/968,510

(22) Filed: Oct. 19, 2004

(65) Prior Publication Data

US 2005/0052102 A1 Mar. 10, 2005

Related U.S. Application Data

(63) Continuation of application No. 10/653,761, filed on Sep. 3, 2003, now Pat. No. 6,830,300, which is a continuation of application No. 10/003,278, filed on Dec. 6, 2001, now Pat. No. 6,659,577.

(51) Int. Cl.
*A47B 88/00* (2006.01)
(52) U.S. Cl. .................................................. 312/334.5
(58) Field of Classification Search ............... 312/334.7, 312/334.8, 333, 334.47, 334.4, 334.5, 223.1, 312/265.4; 211/26
See application file for complete search history.

(56) References Cited

U.S. PATENT DOCUMENTS

| | | | | |
|---|---|---|---|---|
| 3,133,768 | A * | 5/1964 | Klakovich | 384/17 |
| 5,571,256 | A * | 11/1996 | Good et al. | 211/26 |
| 5,833,337 | A * | 11/1998 | Kofstad | 312/334.5 |
| 6,230,903 | B1 * | 5/2001 | Abbott | 211/26 |
| 6,373,707 | B1 * | 4/2002 | Hutchins | 361/725 |
| 6,422,399 | B1 * | 7/2002 | Castillo et al. | 211/26 |
| 6,431,668 | B1 * | 8/2002 | Reddicliffe | 312/334.5 |
| 6,554,142 | B2 * | 4/2003 | Gray | 211/26 |
| 6,659,577 | B2 * | 12/2003 | Lauchner | 312/334.5 |
| 6,685,033 | B1 * | 2/2004 | Baddour et al. | 211/26 |
| 6,935,521 | B2 * | 8/2005 | Gundlach et al. | 211/183 |
| 6,948,691 | B2 * | 9/2005 | Brock et al. | 248/222.13 |
| 6,988,626 | B2 * | 1/2006 | Varghese et al. | 211/26 |

* cited by examiner

*Primary Examiner* — Janet M Wilkens

(57) ABSTRACT

A method for slidably mounting a slide assembly to a computer server unit rack. Front and rear brackets of the slide assembly include a plurality of dual-diameter mounting pins and a pair of spring elements having different lengths. The mounting pins are positioned within holes in the rack columns and one of the spring elements snaps behind the rack column to hold the slide assembly to the rack. If the holes in the rack columns have one diameter, then the mounting pins extend partially through the holes, and the shorter spring element snaps behind the rack column. For a larger diameter or square rack column hole, the mounting pins extend completely through the holes where the longer spring element snaps behind the rack column.

20 Claims, 7 Drawing Sheets

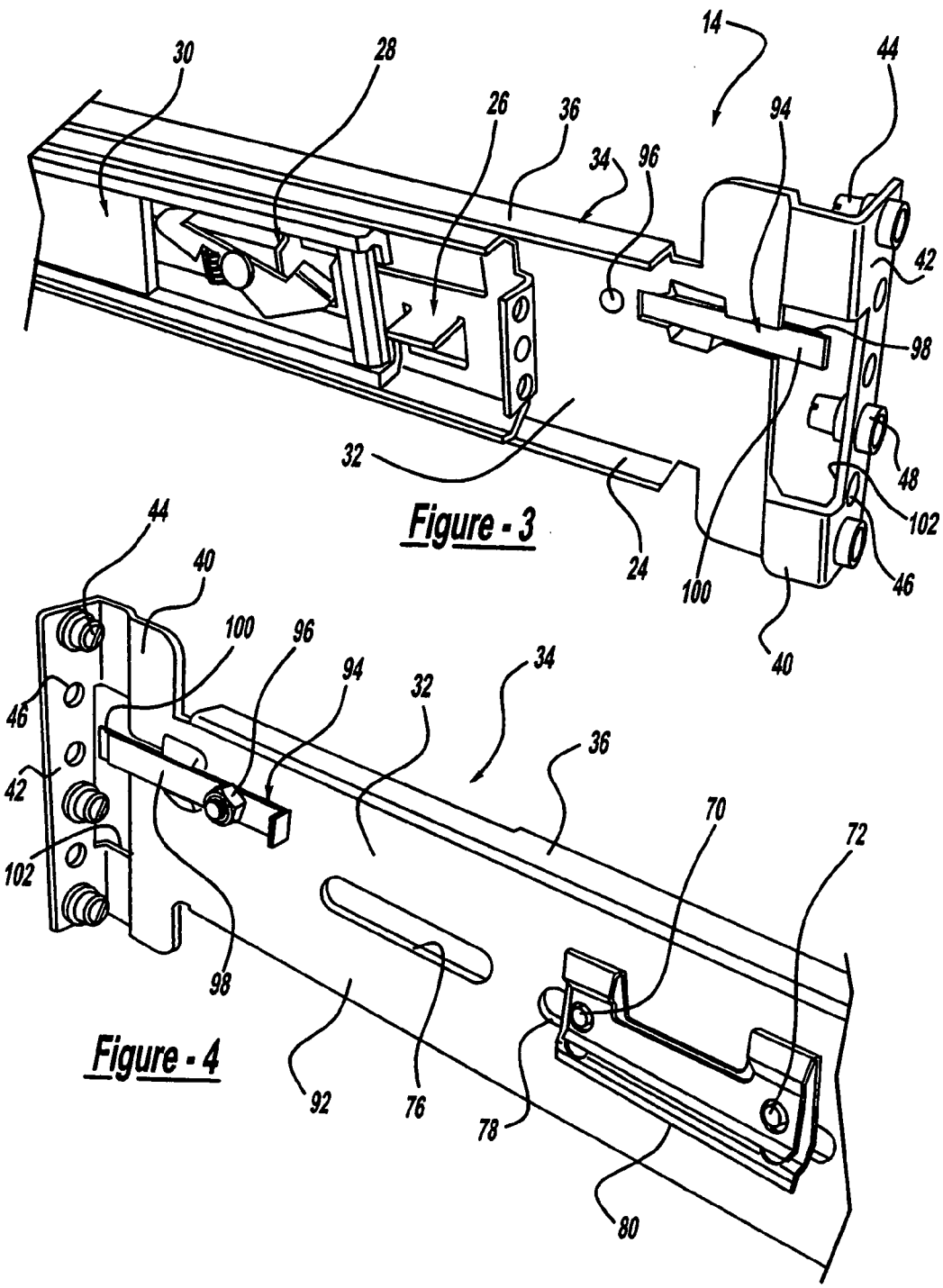

METHOD FOR INSTALLING A SLIDE ASSEMBLY FOR A COMPUTER SERVER USING DUAL FLAT SPRINGS

CROSS-REFERENCE TO RELATED APPLICATIONS

This application is a continuation application of U.S. application Ser. No. 10/653,761, filed Sep. 3, 2003, now U.S. Pat. No. 6,830,300 titled Dual Flat Springs for Tool-Less Slide Installation, which is a continuation application of U.S. application Ser. No. 10/003,278, filed Dec. 6, 2001, titled Dual Flat Springs for Tool-Less Slide Installation, now U.S. Pat. No. 6,659,577.

BACKGROUND OF THE INVENTION

1. Field of the Invention

This invention relates generally to a method for mounting a slide assembly to a computer server rack and, more particularly, to a method for mounting a slide assembly to a computer server rack, where the slide assembly includes front and back attachment brackets and where each attachment bracket includes a pair of spring elements having different lengths and a plurality of dual-diameter attachment pins to allow the slide assembly to be mounted to rack columns having different hole configurations without the need for tools.

2. Discussion of the Related Art

Certain computer systems, such as computer network systems, typically include many separate computer units or servers that are positioned and stacked relative to each other in a rack. The various computer servers in the system are electrically interconnected and provide various functions, such as storage, communications, calculations, etc. The rack includes a plurality of support columns, where each computer server is secured to opposing slide assemblies attached to the columns. The slide assemblies allow the server to be pulled away from the front of the rack so that each separate server can be serviced by technicians for various reasons, such as maintenance, replacement of computer cards, etc., while the server is still in operation. In other words, in order for a technician to gain entrance to the server through top panels in the server, the server is slid forward away from the stack of servers in the rack to allow access thereto, while the server is still operational, so that the computer system does not have to go down during service.

Known slide assemblies generally include a stationary member having a front bracket and a rear bracket, where the front bracket is rigidly secured to a front column of the rack and the rear bracket is rigidly secured to a corresponding rear column of the rack. One or more slidable members are slidably secured to the stationary member on ball bearings. The inner most slidable member is secured to a side wall of the server. When the technician grasps the server and pulls it away from the rack, the slidable members slide relative to the stationary member allowing the server to be extended out of the rack.

The support columns include holes and the front and rear brackets include associated pins. The pins are inserted into the desired holes in the columns to align and hold the slide assembly. Various devices and techniques are known in the art to secure the slide assembly to the columns so that they are securely affixed thereto. These known techniques are sometimes complicated, requiring installation tools and the like to perform the mounting procedure. Also, certain techniques use loose hardware, such as screws and bolts, that may be lost and are inconvenient to keep track of. Further, the configuration of the various rack columns known in the art sometimes prevent the slide assembly to be mounted thereto for a particular column design that the slide assembly was not specifically designed for.

SUMMARY OF THE INVENTION

In accordance with the teachings of the present invention, a method for mounting a slide assembly to a computer server unit rack is disclosed. The slide assembly includes a stationary member and at least one slidable member slidably mounted thereto. A front bracket is mounted to a front end of the stationary member and a rear bracket is mounted to a rear end of the stationary member. The front bracket is secured to a front column of the rack and the rear bracket is secured to the corresponding rear column of the rack to secure the slide assembly thereto.

Both the front and rear brackets include a mounting plate having a plurality of dual-diameter pins extending therefrom. The dual-diameter pins are configured to allow the pins to be inserted into round or square holes in the rack column. The front bracket and the rear bracket each include a pair of spring elements, such as flat, elongated metal strips, having different lengths. When the pins are inserted into the holes in the rack column, the mounting plate will be positioned against the column or be spaced therefrom depending on the diameter of the column holes. If the pins extend partially through the column holes, then the shorter spring element locks behind the column to hold the slide assembly in place. If the pins extend completely into the column holes, then the longer spring element locks behind the column to hold the slide assembly in place.

Additional advantages and features of the present invention will become apparent from the following description and appended claims, taken in conjunction with the accompanying drawings.

BRIEF DESCRIPTION OF THE DRAWINGS

FIG. 3 is a broken-away, perspective view of one side of a rear mounting bracket of the slide assembly showing mounting spring elements, according to an embodiment of the present invention;

FIG. 4 is a broken-away, perspective view of the other side of the rear mounting bracket;

DETAILED DESCRIPTION OF THE EMBODIMENTS

The following discussion of the embodiments of the invention directed to a process for mounting a slide assembly to a computer server unit rack is merely exemplary in nature, and is in no way intended to limit the invention or its applications or uses.

Figure 1:
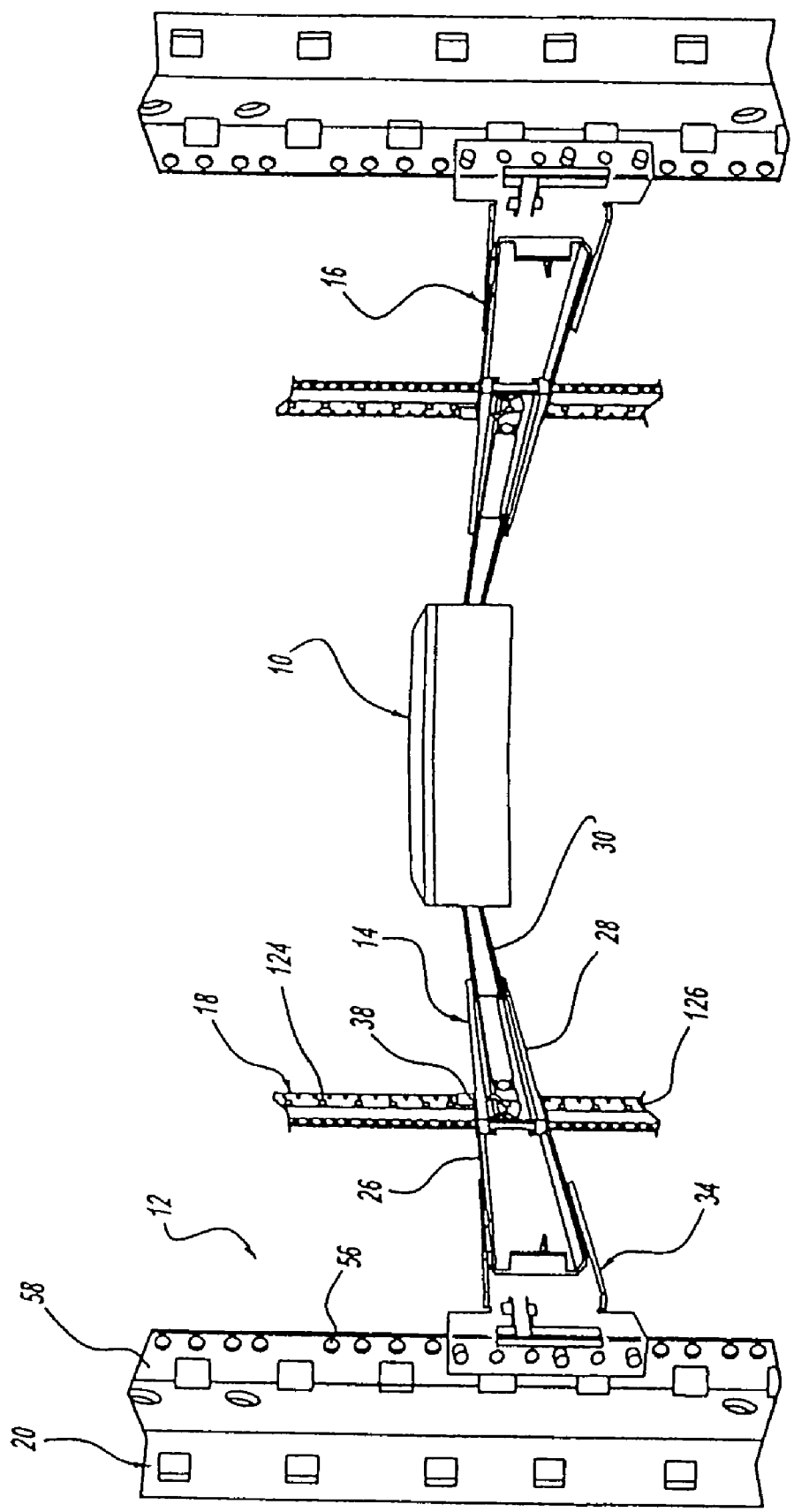
FIG. 1 is a rear perspective view of a computer server unit slidably mounted to a computer rack on opposing slide assemblies, according to an embodiment of the present invention.

FIG. 1 is a rear perspective view of a computer server unit 10 mounted to a computer rack 12 by a pair of opposing slide assemblies 14 and 16. The rack 12 includes front columns 18 and rear columns 20 having a particular column configuration for this purpose, as is well understood in the art. The server unit 10 is shown in a fully extended position, where it has been slid out of a front of the rack 12 on the slide assemblies 14 and 16. In this orientation, a technician can gain access to the server unit 10 while it is still mounted to the rack, and in operation. The slide assembly 14 will be discussed herein, with the understanding that the slide assembly 16 is identical.

The slide assembly 14 includes a stationary member 26, an intermediate slide member 28 and an inner slide member 30. The slide members 28 and 30 are mounted on ball bearings (not shown) in a nested manner, as is understood in the art. In other words, the stationary member 26 is the widest of the three members, and includes a ball bearing device on its inside surface to which the intermediate slide member 28 is mounted. Likewise, the intermediate slide member 28 includes a ball bearing device mounted on its inside surface to which the inner slide member 30 is mounted. The slide assembly 14 further includes a rear mounting bracket 34 rigidly secured to a rear end of the stationary member 26 and a front mounting bracket 38 rigidly secured to a front end of the stationary member 26.

Figure 2:
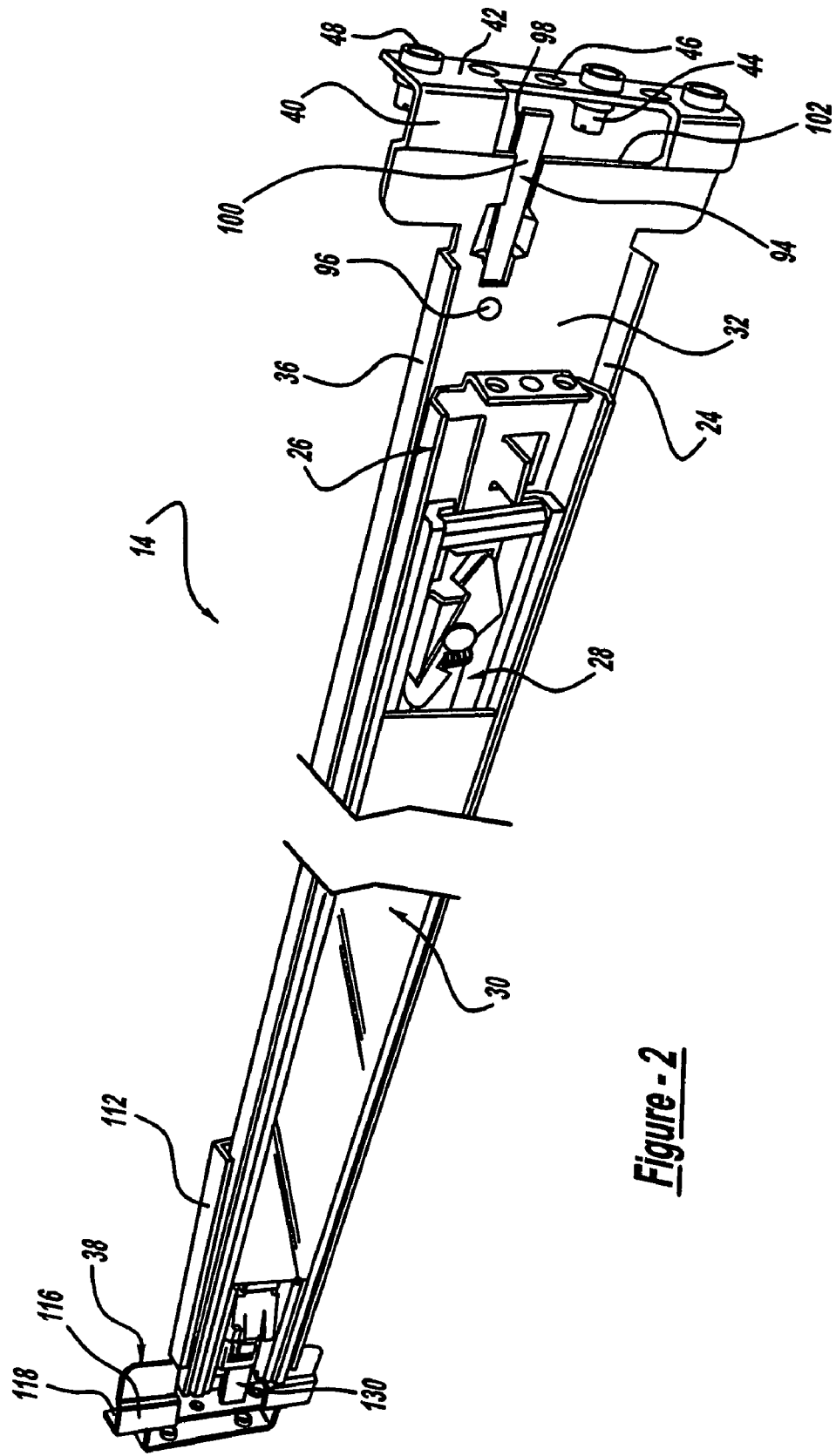
FIG. 2 is a perspective view of one of the slide assemblies shown in FIG. 1 removed from the rack and in a fully retracted position, according to an embodiment of the present invention.

FIG. 2 is a perspective view of the slide assembly 14 removed from the rack 12, and in a retracted position. FIG. 3 is a perspective view of one side of the rear mounting bracket 34 and FIG. 4 is perspective view of the other side of the bracket 34. The bracket 34 includes a side plate 32 having opposing flanges 36 and 24. The bracket 34 further includes an L-shaped mounting portion 40 including an end plate 42 formed at one end of the side plate 32. A plurality of mounting pins 44, here three, extend through openings 46 in the end plate 42 and are rigidly mounted thereto by a nut 48. The mounting pins 44 are inserted within strategically positioned openings 56 in a flange 58 of the rear column 20, as will be discussed in more detail below.

Figure 5:
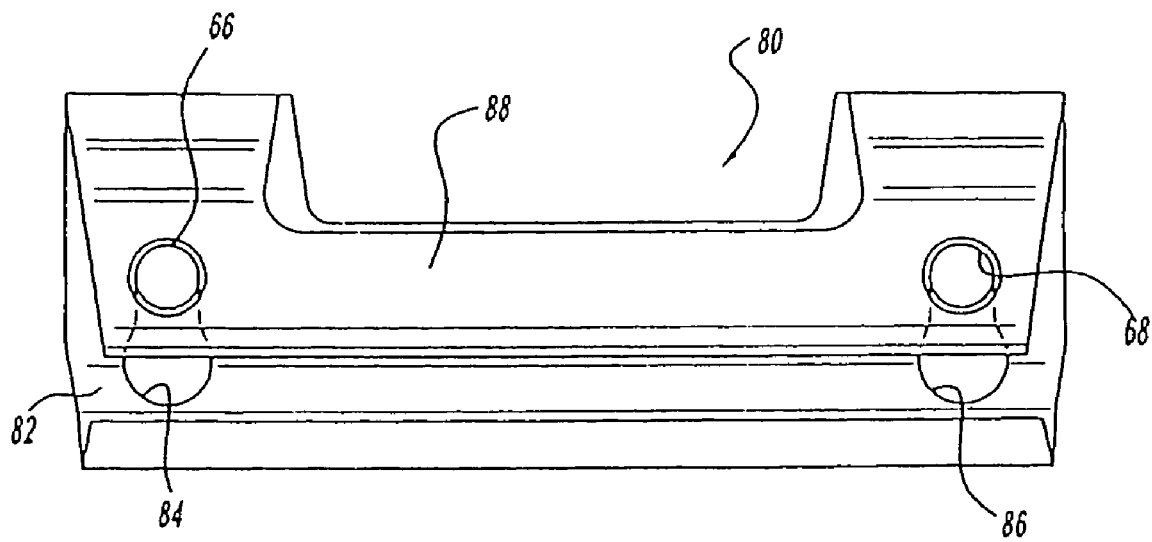
FIG. 5 is a front view of a clip device for securing the rear mounting bracket to the slide assembly, according to the invention.

The stationary member 26 includes a pair of pins 70 and 72 and the bracket 34 includes a plurality of extended slots 76 and 78. During assembly, the pins 70 and 72 are aligned and pushed through the slots 76 and 78 at the location suitable for proper spacing between the columns 18 and 20. A clip device 80 is then positioned on the pins 70 and 72 and against the side plate 32 opposite to the stationary member 26. The clip device 80 is clipped to the pins 70 and 72 so that the bracket 34 is maintained in the proper position. A front view of the clip device 80 is shown in FIG. 5. The clip device 80 includes a back plate 82 having slots 84 and 86 and a front plate 88 having openings 66 and 68 that receive and lock the pins 70 and 72.

According to the invention, the rear bracket 34 includes a spring assembly 94 mounted to a rear surface 92 of the side plate 32 by a nut and bolt 96. As will be discussed in more detail below, the spring assembly 94 includes a pair of flat metal spring elements 98 and 100 that are positioned side by side and against each other, as shown. As is apparent, the spring element 100 is slightly longer than the spring element 98. The spring elements 98 and 100 extend relative to an opening 102 between the side plate 32 and the mounting portion 40. Thus, the spring elements 98 and 100 can flex in a direction perpendicular to the plane of the slide plate 32 relative to the opening 102.

Figure 6:
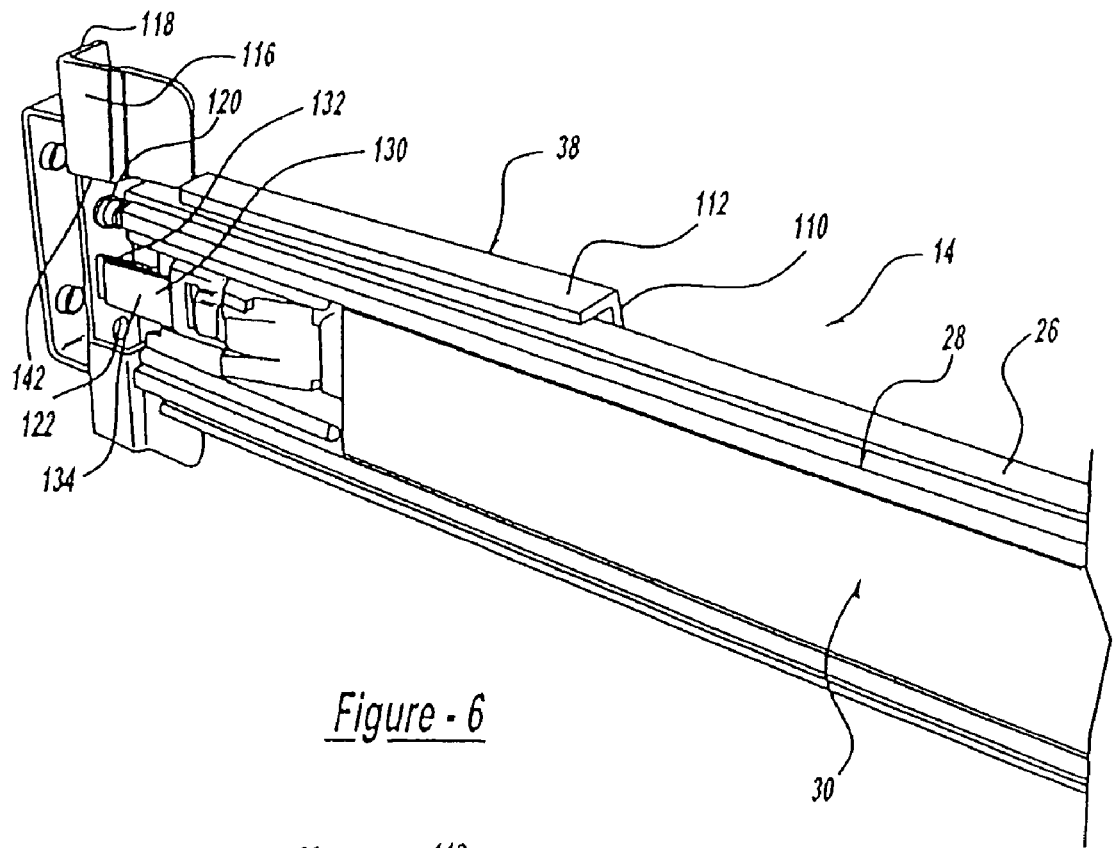
FIG. 6 is a broken-away, perspective view of one side of a front mounting bracket of the slide assembly showing mounting spring elements, according to an embodiment of the present invention.
Figure 7:
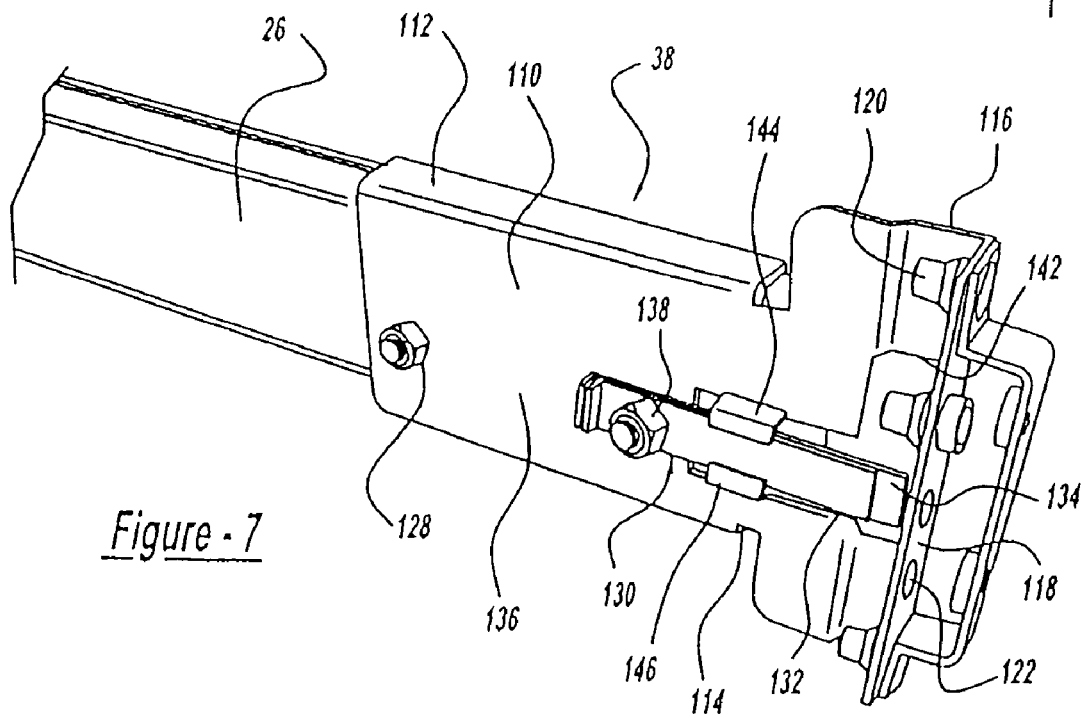
FIG. 7 is a broken-away, perspective view of the other side of the front mounting bracket.

The front mounting bracket 38 is similar in configuration to the rear bracket 34. FIG. 6 is a perspective view of one side of the bracket 38 and FIG. 7 is a perspective view of the other side of the bracket 38. The bracket 38 also includes a side plate 110 having opposing flanges 112 and 114. The front mounting bracket 38 further includes an L-shaped mounting portion 116 including an end plate 118 formed at the end of the side plate 110. A plurality of mounting pins 120, here three, extend through openings 122 in the end plate 118 and are rigidly mounted thereto. The mounting pins 120 are inserted within strategically positioned openings 124 in a flange 126 of the front column 18. The front bracket 38 is rigidly secured to the stationary member 26 by a nut and bolt 128 extending through the side plate 110 and the stationary member 26. The distance between the brackets 34 and 38 and the end plates 42 and 118 is thus set by the position of the rear bracket 34 relative to the stationary member 26, as discussed above.

The front bracket 38 also includes a spring assembly 130 including flat metal spring elements 132 and 134 positioned against each other. As is apparent, the spring element 134 is longer than the spring element 132. The elements 132 and 134 are secured to a rear surface 136 of the side plate 110 by a nut and bolt 138. The spring elements 132 and 134 extend relative to an opening 142 in the bracket 38 between the side plate 110 and the mounting portion 116. A pair of L-shaped flanges 144 and 146 secured to the side plate 110 are formed around the spring elements 132 and 134, as shown, to prevent buckling of the elements 132 and 134.

As is known in the art, rack columns come in different designs where the holes have different diameters and may be round or square. The slide assembly 14 of the present invention can be used with many rack designs. According to the invention, the pins 44 and 120 are dual diameter pins to accommodate openings in the columns 18 and 20 of different sizes and shapes. The dual diameter pins 44 and 120 are used in cooperation with the spring elements 98, 100, 132 and 134 to rigidly mount the slide assembly 14 to the columns 18 and 20 without the need for tools or complicated securing devices. The spring assemblies 94 and 130 also allow the slide assembly 14 to be easily removed from the columns 18 and 20.

Figure 8:
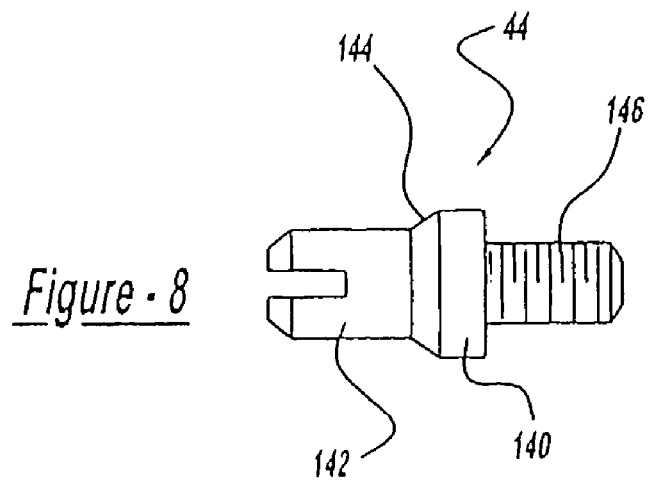
FIG. 8 is a side view of one of the mounting pins used to secure the slide assembly to the rack, according to the invention.

FIG. 8 is a side view of one of the pins 44 showing the dual diameter configuration. The pins 120 would look the same. The pin 44 includes a base portion 140 of one diameter and a tip portion 142 of a narrower diameter defining a shoulder 144 therebetween. A threaded post 146 extends from the base portion 140 opposite to the tip portion 142. The threaded post 146 extends through an opening in the end plate 42 and is secured thereto by the nut 48.

Figure 9:
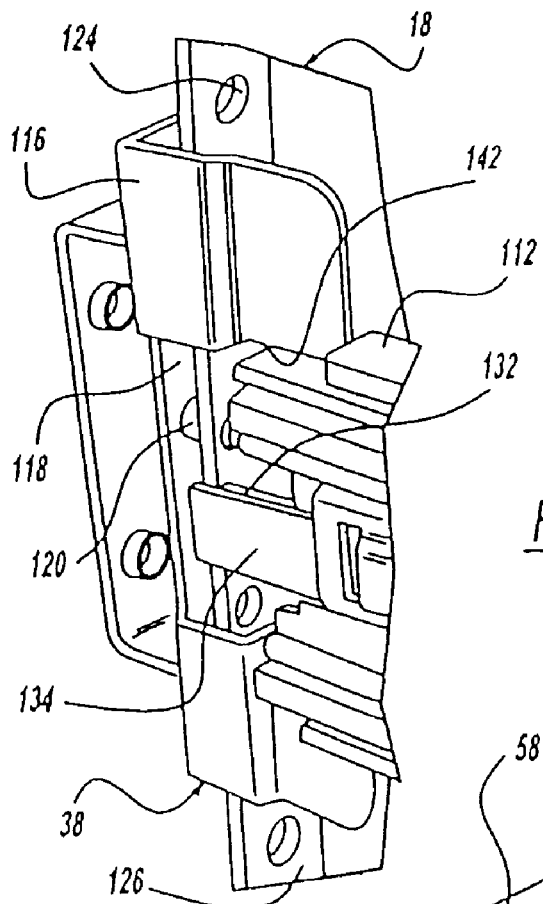
FIG. 9 is a broken-away, perspective view of the front bracket of the slide assembly mounted to a rack column having round mounting holes, according to the invention.

FIG. 9 is a broken-away, perspective view of the front bracket 38 mounted to the front column 18. In this embodiment, the front column, 18 includes the round holes 124 of a known diameter. Because the holes 124 are round and of a limited diameter, the pins 120 only extend through the holes 124 far enough to contact the shoulder 144 between the base portion 140 and the tip portion 142. In other words, the diameter of the base portion 140 and the diameter of the tip portion 142 are selected so that the tip portion 142 fits through the holes 124, but the base portion 140 does not. Thus, a gap between the flange 126 and the end plate 118 that is about the width of the base portion 140 is provided. The bracket 38 is locked to the column 18 by the shorter spring element 132 that snaps behind the flange 126 opposite to the end plate 118 to hold the bracket 38 thereto. The other spring element 134 rests against an outside edge of the flange 126, and is not operable to hold the bracket 38 in place in this embodiment.

Figure 10:
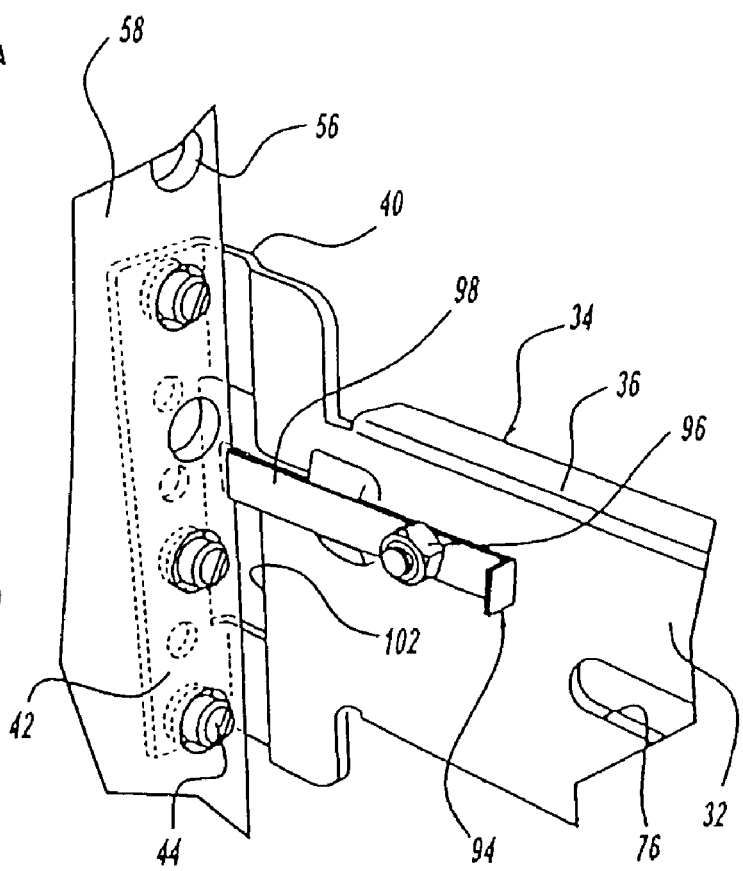
FIG. 10 is a broken-away, perspective view of the rear bracket of the slide assembly mounted to a rack column having round mounting holes, according to the invention.

FIG. 10 is a broken-away, perspective view of the rear bracket 34 secured to the rear column 20, where the holes 56 are round. As above, only the tip portion 142 extends through the holes 56 where the shoulder 144 of the pin 44 abuts against the flange 58 providing a space between the end plate 42 and the flange 58. In this configuration, the shorter spring element 98 snaps behind the flange 58 opposite to the end plate 42, and secures the bracket 34 thereto. The spring element 100 is too long to fit behind the flange 58 in this configuration, and thus rests against an edge of the flange 58. Thus, it is the spring element 98 that holds the bracket 34 to the column 20. As will be appreciated by the those skilled in the art, if the size and shape of the various and known holes in the columns 18 and 20 were fixed, then only one spring element would be required.

Figure 11:
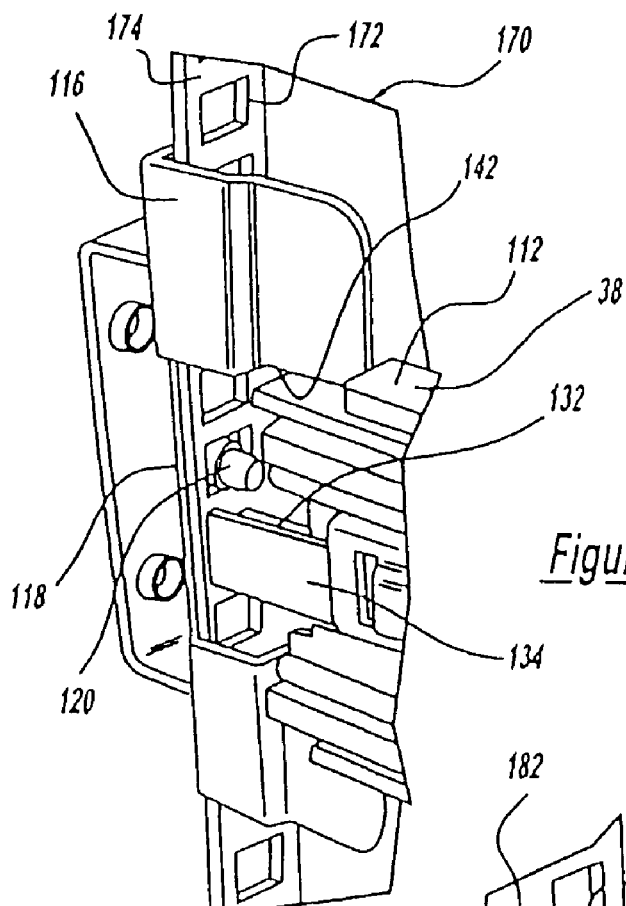
FIG. 11 is a broken-away, perspective view of the front bracket of the slide assembly mounted to a rack column having square holes, according to the invention.

According to one embodiment of the invention, the pins 44 are shaped to allow the slide assembly 14 to be secured to the columns of a rack that may have square holes, or round holes larger than the round holes 56. FIG. 11 is a broken-away perspective view of the front bracket 38 secured to a column 170 including a flange 174 having square holes 172. The square holes 172 have a larger diameter than the round holes 124 so that the base portion 140 of the pin extends through the hole 172 until the end plate 118 is positioned flush against the flange 174 of the column 170. In this configuration, the spring element 132 is too short to hold the bracket 38 rigidly in place, and thus the longer spring element 134 is used for this purpose. As shown, the spring element 134 snaps behind the flange 174 to hold the bracket 38 in place.

Figure 12:
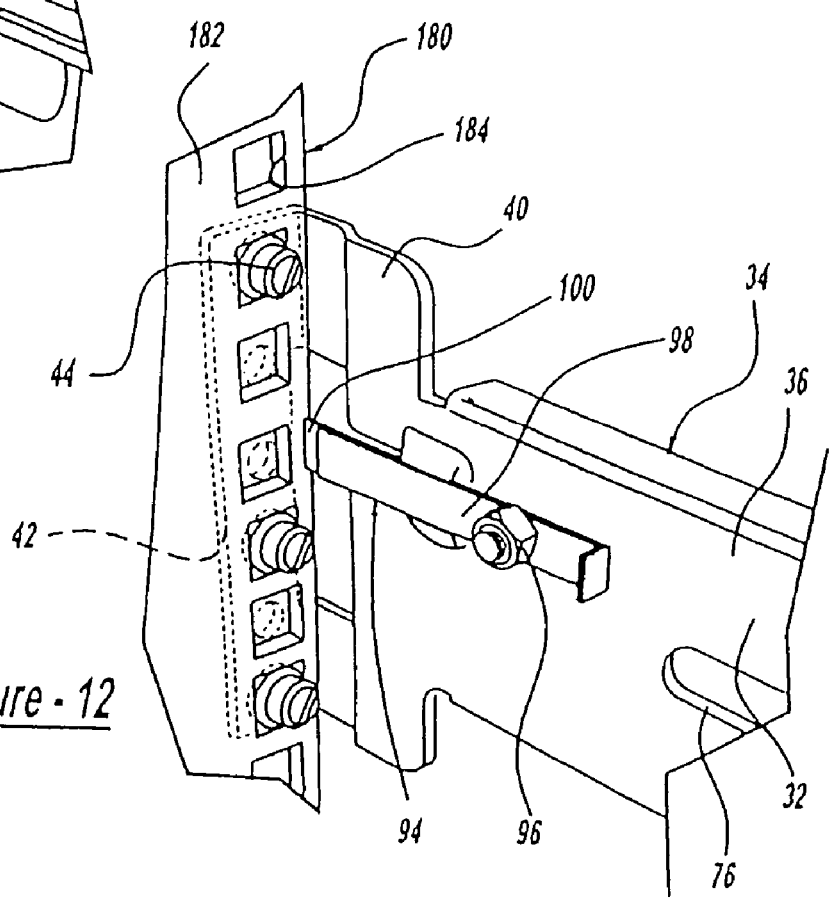
FIG. 12 is a broken-away, perspective view of the rear bracket of the slide assembly mounted to a rack column including square holes, according to the invention.

In FIG. 12, the rear bracket 34 is secured to a column 180 having a flange 182 and square holes 184 extending therethrough. As above, the pin 44 extends through the hole 184 until the end plate 42 abuts against the flange 182. In this configuration, the spring element 98 is too short to hold the rear bracket 34 securely in place, but the spring element 100 has the right length to snap behind the flange 182 opposite to the end plate 42 and hold the bracket 34 in place. In this configuration, the shorter spring element 98 does not act to hold the bracket 34 in place.

When the slide assembly 14 is to be removed from the rack 12, the appropriate spring element is flexed into the opening so that the bracket is not secured to the column, and can be removed in that manner.

The foregoing discussion discloses and describes merely exemplary embodiments of the present invention. One skilled in the art will readily recognize from such discussion, and from the accompanying drawings and claims, that various changes, modifications or variations can be made therein without departing from the spirit and scope of the invention as defined in the following claims.

What is claimed is:

1. A method for mounting a slide assembly to a computer server rack including a rack column, said method comprising:
   providing a member;
   providing a bracket including a base plate, a mounting plate, at least one pin rigidly secured to the mounting plate, and a pair of opposing spring elements where one of the spring elements is shorter than the other spring element;
   mounting the bracket to the member;
   inserting the at least one pin into a hole in the rack column; and
   positioning one of the spring elements behind the rack column to hold the bracket in place.

2. The method according to claim 1 wherein providing a bracket includes providing a bracket including spring elements that are a flat piece of metal secured to the base plate.

3. The method according to claim 1 wherein providing a bracket includes providing a bracket where the spring elements each have an end positioned relative to an opening in the base plate.

4. The method according to claim 1 wherein providing a bracket includes providing a bracket having three pins rigidly secured to the mounting plate.

5. The method according to claim 1 wherein providing a member includes providing a member having a pair of pins and providing a bracket includes providing a bracket including a base plate having at least one slot, and wherein mounting the bracket to the member includes mounting the bracket to the member with a clip device by inserting the pair of pins in the at least one slot and clipping the clip to the pair of pins to secure the bracket to the member.

6. The method according to claim 1 wherein providing a bracket includes providing a bracket having a dual-diameter pin including a base portion and a tip portion having different diameters and defining a shoulder therebetween.

7. The method according to claim 6 wherein mounting the bracket to the rack column includes inserting the dual-diameter pin into the hole in the rack column a distance depending on the size of the hole, and wherein positioning one of the spring elements behind the rack column includes positioning the shorter spring element behind the rack column to hold the bracket in place if the rack column rests against the shoulder of the pin and positioning the longer spring element behind the rack column to hold the bracket in place if the pin is inserted completely through the hole.

8. A method for mounting a slide assembly to a computer server rack, said rack including a front rack column and a rear rack column having aligned holes, said method comprising:
   providing an elongated stationary member including a first end and a second end;
   providing a front bracket including a front base plate, a front mounting plate, at least one front pin rigidly secured to the front mounting plate, and a pair of opposing front spring elements where one of the front spring elements is shorter than the other front spring element;
   mounting the front bracket to the first end of the stationary member;
   providing a rear bracket including a rear base plate, a rear mounting plate, at least one rear pin rigidly secured to the rear mounting plate, and a pair of opposing rear spring elements where one of the rear spring elements is shorter than the other rear spring element;
   mounting the rear bracket to the second end of the stationary member;
   inserting the at least one front pin into a hole in the front rack column;

positioning one of the front spring elements behind the front rack column to hold the front bracket in place;

inserting the at least one rear pin into a hole in the rear column; and positioning one of the rear spring elements behind the back rack column to hold the rear bracket in place.

9. The method according to claim 8 wherein providing a front bracket includes providing a front bracket where the opposing front spring elements are flat pieces of metal secured to the front base plate and providing a rear bracket includes providing a rear bracket where the opposing rear spring elements are flat pieces of metal secured to the back base plate.

10. The method according to claim 8 wherein providing a front bracket includes providing the front spring elements positioned relative to an opening in the front base plate and wherein providing the rear bracket includes providing the rear spring elements positioned relative to an opening in the rear base plate.

11. The method according to claim 8 wherein providing a stationary member includes providing a stationary member having a pair of pins at the first and second ends, providing a front bracket includes providing a front bracket having a front base plate, and providing a rear bracket includes providing a rear bracket having a rear base plate with at least one slot, wherein mounting the rear bracket to the second end of the stationary member includes inserting the pair of pins at the second end of the member through the slot in the rear base plate and clipping a clip device over the pair of pins.

12. The method according to claim 11 wherein providing a front bracket and a rear bracket includes providing a plurality of slots in the front base plate or the rear base plate and wherein mounting the front bracket and the rear bracket to the stationary member includes positioning a pair of pins on the stationary member in one of the plurality of slots to set the length of the slide assembly.

13. The method according to claim 8 wherein providing a front bracket includes providing a front bracket with three front pins and providing a rear bracket includes providing a rear bracket with three rear pins.

14. The method according to claim 8 wherein providing a front bracket includes providing a front bracket with at least one front dual-diameter pin having a base portion and a tip portion defining a shoulder therebetween, and wherein providing a rear bracket includes providing a rear bracket with at least one rear dual-diameter pin having a base portion and a tip portion defining a shoulder therebetween.

15. The method according to claim 14 wherein mounting the front bracket to the front column and positioning one of the front spring elements include inserting the at least one front dual-diameter pin into the hole in the front column a distance where the shorter front spring element is positioned behind the front column to hold the front bracket in place if the front column rests against the shoulder of the front dual-diameter pin and the longer front spring element is positioned behind the front column to hold the front bracket in place if the front dual-diameter pin is inserted completely through the hole, and wherein mounting the rear bracket to the rear column and positioning one of the rear spring elements include inserting the at least one rear dual-diameter pin into the hole in the back column a distance where the shorter rear spring element is positioned behind the rear column to hold the rear bracket in place if the rear column rests against the shoulder of the rear dual-diameter pin and the longer spring element is positioned behind the rear column to hold the rear bracket in place if the rear dual-diameter pin is inserted completely through the hole.

16. The method according to claim 8 further comprising providing an intermediate slide member assembly secured to the stationary member and an inner slide member slidably secured to the intermediate slide member.

17. A method for mounting a slide assembly to a computer server rack, said rack including a front rack column and a back rack column having aligned holes, said method comprising:

providing an elongated stationary member including a first end and a second end;

providing an intermediate slide member;

slidably securing the intermediate slide member to the elongated stationary member;

providing an inner slide member;

slidably securing the inner slide member to the intermediate slide member;

providing a front bracket including a front base plate, a front mounting plate and at least one front dual-diameter pin rigidly secured to the front mounting plate, and a pair of opposing front spring elements where one of the front spring elements is shorter than the other front spring element, said front dual-diameter pin including a base portion and a tip portion having different diameters defining a shoulder therebetween;

mounting the front bracket to the first end of the stationary member;

providing a rear bracket including a rear base plate, a rear mounting plate, at least one rear dual-diameter pin rigidly secured to the rear mounting plate, and a pair of opposing rear spring elements where one of the rear spring elements is shorter than the other rear spring element, said rear dual-diameter pin including a base portion and a tip portion having different diameters defining a shoulder therebetween;

mounting the rear bracket to the second end of the stationary member;

inserting the at least one front dual-diameter pin into a hole in the front column of the rack;

positioning one of the front spring elements behind the front column to hold the front bracket in place;

inserting the at least one rear dual-diameter pin into a hole in the back column of the rack; and positioning one of the rear spring elements behind the back column to hold the rear bracket in place.

18. The method according to claim 17 wherein providing a front bracket includes providing a front bracket where the opposing front spring elements are flat pieces of metal secured to the front base plate and providing a rear bracket includes providing a rear bracket where the rear spring elements are flat pieces of metal secured to the back base plate.

19. The method according to claim 17 wherein providing a front bracket includes providing the front spring elements positioned relative to an opening in the front base plate and wherein providing the rear bracket includes providing the rear spring elements positioned relative to an opening in the rear base plate.

20. The method according to claim 17 wherein mounting the front bracket to the front column and positioning one of the front spring elements include inserting the at least one front dual-diameter pin into the hole in the front column a distance where the shorter front spring element is positioned behind the front column to hold the front bracket in place if the front column rests against the shoulder of the front dual-diameter pin and the longer front spring element is positioned behind the front column to hold the front bracket in place if the front dual-diameter pin is inserted completely through the hole, and wherein mounting the rear bracket to the rear column and positioning one of the rear spring elements include inserting the rear dual-diameter pin into the hole in the back column a distance where the shorter rear spring element is positioned behind the rear column to hold the rear bracket in place if the rear column rests against the shoulder of the rear dual-diameter pin and the longer spring element is positioned behind the rear column to hold the rear bracket in place if the rear dual-diameter pin is inserted completely through the hole.

* * * * *